(12) United States Patent
Babcock et al.

(10) Patent No.: US 10,269,895 B2
(45) Date of Patent: *Apr. 23, 2019

(54) METHOD FOR CREATING THE HIGH VOLTAGE COMPLEMENTARY BJT WITH LATERAL COLLECTOR ON BULK SUBSTRATE WITH RESURF EFFECT

(71) Applicant: Texas Instruments Incorporated, Dallas, TX (US)

(72) Inventors: Jeffrey A. Babcock, Sunnyvale, CA (US); Alexei Sadovnikov, Sunnyvale, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/647,493

(22) Filed: Jul. 12, 2017

(65) Prior Publication Data

US 2017/0309703 A1    Oct. 26, 2017

Related U.S. Application Data

(60) Continuation of application No. 15/098,452, filed on Apr. 14, 2016, now Pat. No. 9,741,790, which is a (Continued)

(51) Int. Cl.
*H01L 29/66* (2006.01)
*H01L 29/06* (2006.01)
(Continued)

(52) U.S. Cl.
CPC ...... *H01L 29/063* (2013.01); *H01L 21/26513* (2013.01); *H01L 21/308* (2013.01);
(Continued)

(58) Field of Classification Search
CPC .......... H01L 27/1463; H01L 27/14612; H01L 27/14636; H01L 27/14627
See application file for complete search history.

(56) References Cited

U.S. PATENT DOCUMENTS 5,124,772 A   6/1992   Hideshima et al.
6,633,069 B2  10/2003  Nii et al.
(Continued)

OTHER PUBLICATIONS

"A Review of RESURF Technology," Philips Research, Eindhoven, The Netherlands ISP50 '2000, May 22-25, Toulouse, France, pp. 11-18 (Adriaan W. Ludikhuize).

*Primary Examiner* — Selim U Ahmed
(74) *Attorney, Agent, or Firm* — Jacqueline J. Garner; Charles A. Brill; Frank D. Cimino

(57) ABSTRACT

Complementary high-voltage bipolar transistors formed in standard bulk silicon integrated circuits are disclosed. In one disclosed embodiment, collector regions are formed in an epitaxial silicon layer. Base regions and emitters are disposed over the collector region. An n-type region is formed under collector region by implanting donor impurities into a p-substrate for the PNP transistor and implanting acceptor impurities into the p-substrate for the NPN transistor prior to depositing the collector epitaxial regions. Later in the process flow these n-type and p-type regions are connected to the top of the die by a deep n+ and p+ wells respectively. The n-type well is then coupled to VCC while the p-type well is coupled to GND, providing laterally depleted portions of the PNP and NPN collector regions and hence, increasing their BVs.

16 Claims, 4 Drawing Sheets

Related U.S. Application Data division of application No. 14/245,099, filed on Apr. 4, 2014, now Pat. No. 9,343,459.

(51) Int. Cl.
| | |
|---|---|
| H01L 27/082 | (2006.01) |
| H01L 29/04 | (2006.01) |
| H01L 29/16 | (2006.01) |
| H01L 21/265 | (2006.01) |
| H01L 21/762 | (2006.01) |
| H01L 21/306 | (2006.01) |
| H01L 21/308 | (2006.01) |
| H01L 29/08 | (2006.01) |
| H01L 21/8228 | (2006.01) |
| H01L 29/10 | (2006.01) |
| H01L 29/732 | (2006.01) |
| H01L 21/266 | (2006.01) |

(52) U.S. Cl.
CPC .. *H01L 21/30604* (2013.01); *H01L 21/76224* (2013.01); *H01L 21/76232* (2013.01); *H01L 21/8228* (2013.01); *H01L 21/82285* (2013.01); *H01L 27/082* (2013.01); *H01L 27/0826* (2013.01); *H01L 29/04* (2013.01); *H01L 29/0649* (2013.01); *H01L 29/0808* (2013.01); *H01L 29/0821* (2013.01); *H01L 29/0826* (2013.01); *H01L 29/1095* (2013.01); *H01L 29/16* (2013.01); *H01L 29/732* (2013.01); *H01L 21/266* (2013.01)

(56) References Cited

U.S. PATENT DOCUMENTS

| | | |
|---|---|---|
| 6,770,952 B2 | 8/2004 | Babcock et al. |
| 7,303,969 B2 | 12/2007 | Berger et al. |
| 7,576,406 B2 | 8/2009 | Tamaki et al. |
| 8,022,480 B2 | 9/2011 | Kim et al. |
| 9,741,790 B2 * | 8/2017 | Babcock ............... H01L 29/063 |

* cited by examiner

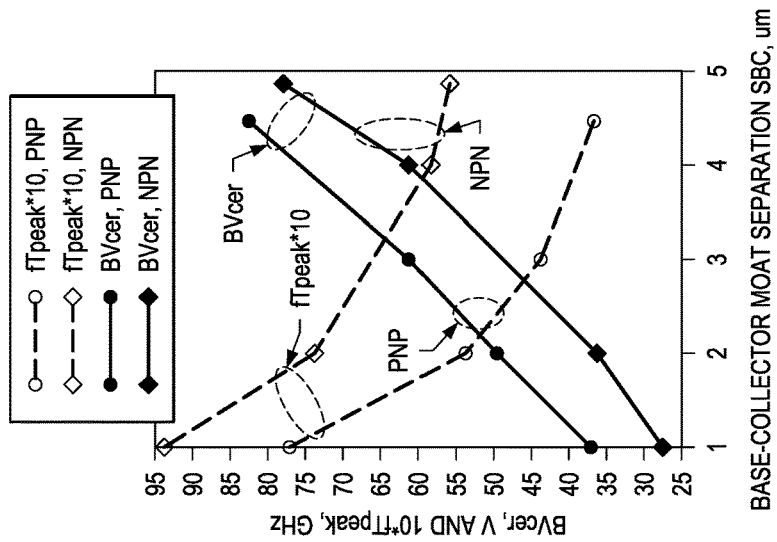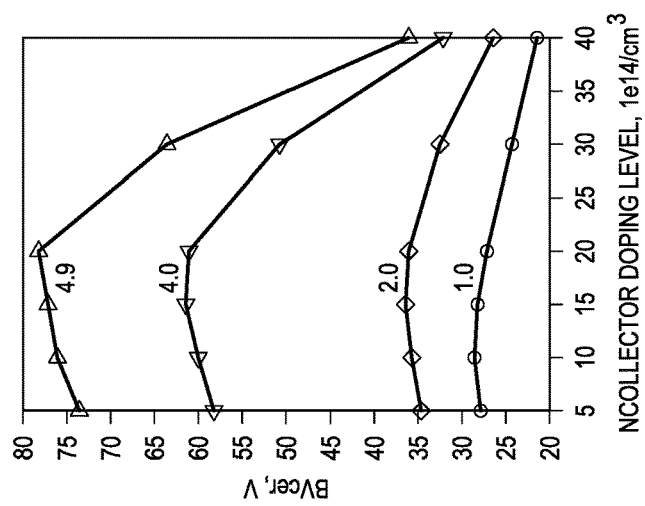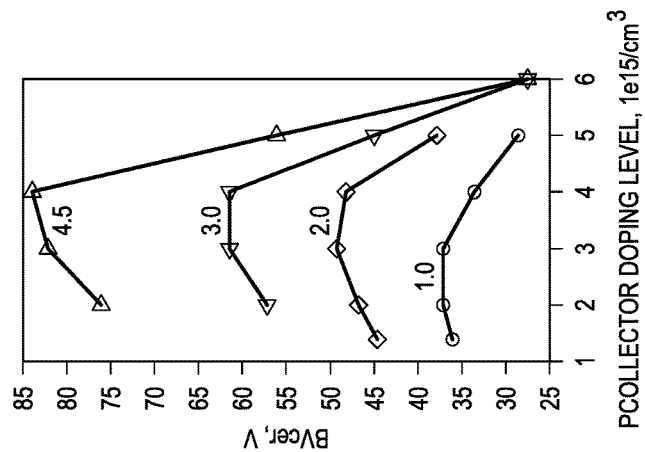

METHOD FOR CREATING THE HIGH VOLTAGE COMPLEMENTARY BJT WITH LATERAL COLLECTOR ON BULK SUBSTRATE WITH RESURF EFFECT

CROSS REFERENCE TO RELATED APPLICATIONS

This application is a continuation of U.S. Nonprovisional patent application Ser. No. 15/098,452, filed Apr. 14, 2016, which is a divisional of U.S. Nonprovisional patent application Ser. No. 14/245,099, filed Apr. 4, 2014 (now U.S. Pat. No. 9,343,459), the contents of both of which are herein incorporated by reference in its entirety.

FIELD OF THE INVENTION

This invention is in the field of bipolar transistor fabrication, and is more specifically directed to the fabrication of complementary transistors having varying characteristics on a common substrate using bulk silicon technology.

BACKGROUND OF THE INVENTION

Integrated circuits have utilized bipolar junction transistors for many years, taking advantage of their high gain characteristics to satisfy high performance and high current drive needs. In particular, as is well known in the art, bipolar transistors are especially well-suited for high frequency applications, such as now used in wireless communications.

Silicon-on-insulator (SOI) technology is also well-known in the art as providing important advantages in high-frequency electronic devices. As is fundamental in SOI technology, active devices such as transistors are formed in single-crystal silicon layers formed over an insulator layer, such as a layer of silicon dioxide commonly referred to as buried oxide (BOX). The buried oxide layer isolates the active devices from the underlying substrate, effectively eliminating parasitic nonlinear junction capacitances to the substrate and reducing collector-to-substrate capacitances. To the extent that high frequency performance of bulk transistors was limited by substrate capacitance, SOI technology provides significant improvement.

Record $f_T$peak*$BV_{CEO}$ product has been achieved for both NPN and PNP. This was possible due to re-surf effect from the substrate through buried oxide on low-doped collector region.

However, high cost of SOI substrates prohibit mass product development using this technology. In addition, a split voltage source is required to implement re-surf effect in PNP (for a grounded substrate). It has also been observed that significant self-heating occurs at currents above $f_T$peak and large $V_{CE}$.

A conventional SOI bipolar transistor is designed to be a high performance device. However, a high performance transistor is somewhat limited by its construction, from a standpoint of both breakdown voltage and performance. As is fundamental in the art, the collector emitter breakdown voltage (BVCEO) depends upon the thickness of collector region and upon the doping concentration of the collector region. Lighter doping of the collector region and a thicker collector region would increase this breakdown voltage.

In real circuits, the emitter and bases complementary SiGe bipolar junction transistor (BJTs) are biased around the highest potential Vcc (relative to grounded substrate) while the collectors are switched between Vcc and 0. High B-C bias corresponds to zero potential at collector.

What is needed is a method of increasing PNP BV without decreasing collector doping concentration or increasing collector region thickness of the PNP while including a high voltage NPN on the same bulk processed circuit/substrate.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

In accordance with an embodiment of the present application, an integrated circuit structure, the integrated circuit structure comprising: complementary PNP and NPN structures; wherein the PNP and NPN structures include a p-type bulk semiconductor substrate; PNP and NPN active device regions; buried N+ and P+ resurf regions; wherein both the p-type region and the active device PNP and NPN regions are implemented with single-crystal silicon; and deep trench isolation regions surrounding each transistor, wherein the deep trench isolation regions isolate the complementary PNP and NPN structures from each other.

In accordance with another embodiment of the present application, a method of forming complementary PNP and NPN structures, the method of forming complementary PNP and NPN structures comprising: providing a p-type bulk semiconductor substrate; creating PNP and NPN active device regions; implanting buried N+ and P+ resurf regions in the PNP and NPN device regions respectively; implementing both the bulk semiconductor substrate and PNP and NPN device regions with single-crystal silicon; and surrounding each transistor with deep trench isolation regions to isolate the complementary PNP and NPN structures from each other.

DESCRIPTION OF THE VIEWS OF THE DRAWING

FIG. 2 shows the dependency of $BV_{CER}$ on the collector doping level of the PNP for various base-collector spacings SBC in µm.

FIG. 3 shows the dependency of $BV_{CER}$ on the collector doping level of the NPN for various base-collector spacings SBC in µm.

FIG. 4 shows the dependency of $BV_{CER}$ on for various base-collector spacings SBC in µm for both NPNs and PNPs.

In the drawings, like reference numerals are sometimes used to designate like structural elements. It should also be appreciated that the depictions in the figures are diagrammatic and not to scale.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 1A:
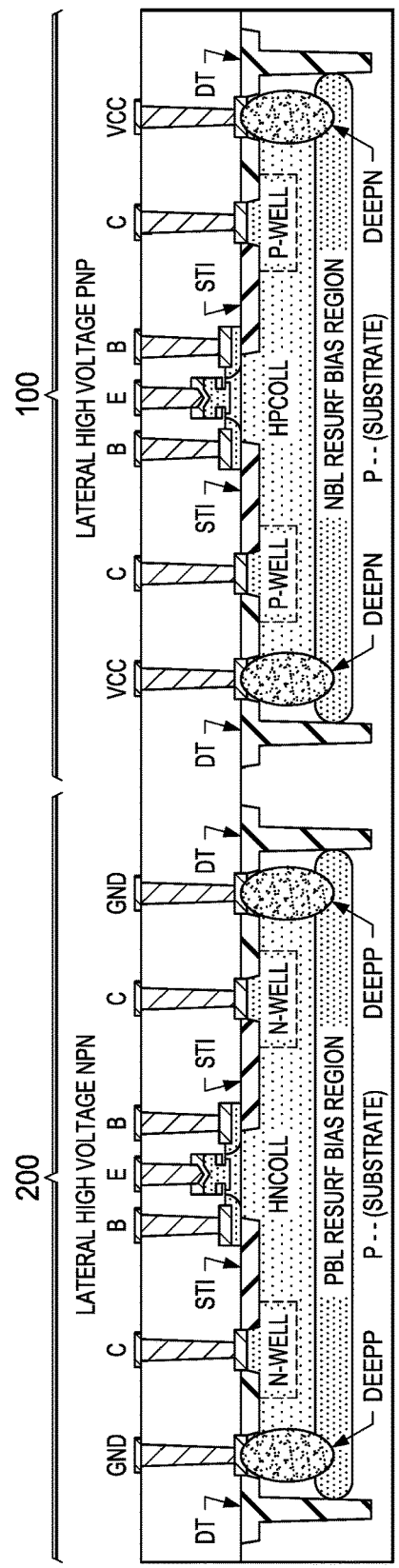
FIG. 1A illustrates a cross-section of an embodiment of the present invention.
Figure 1B:
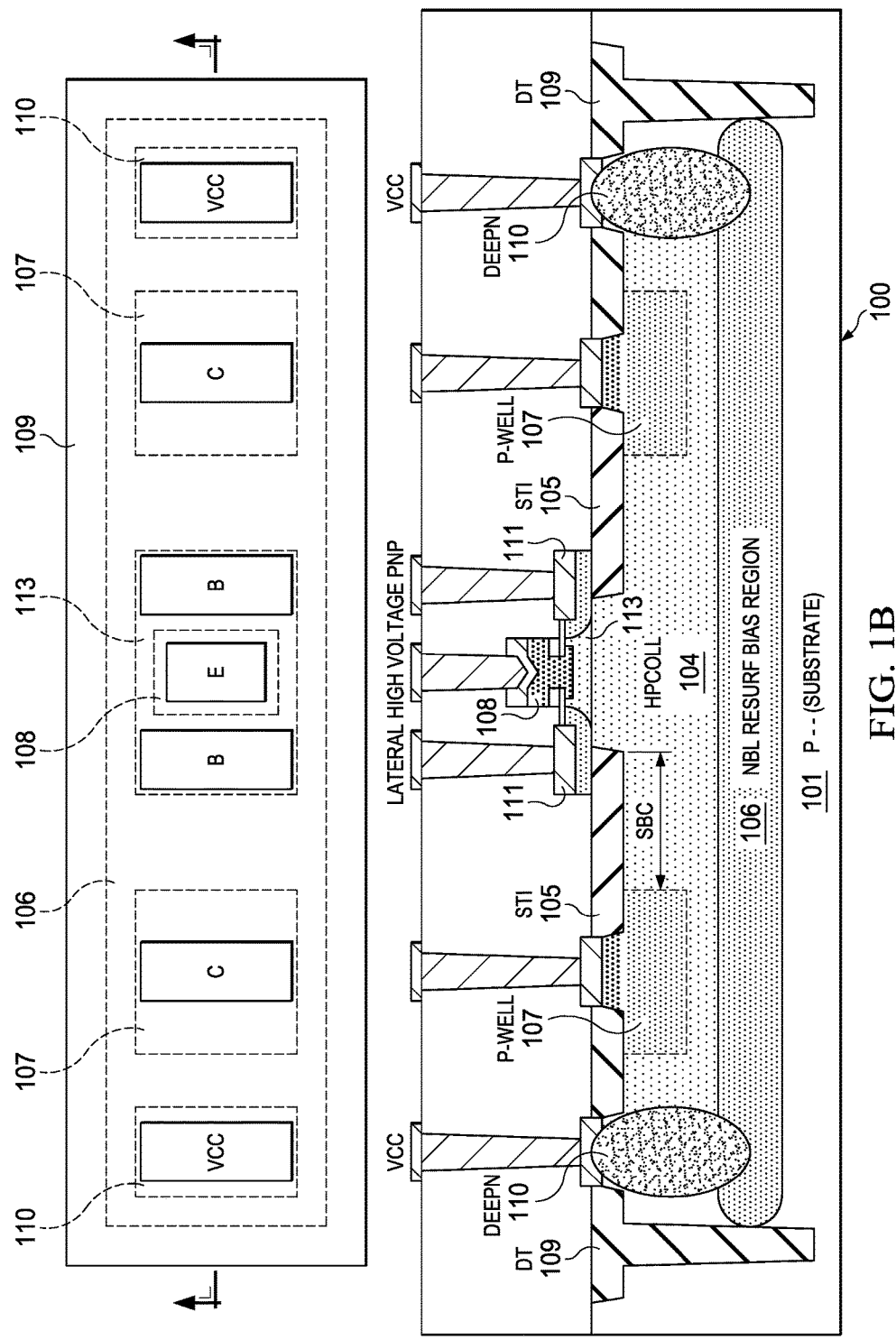
FIG. 1B illustrates an enlarged portion of FIG. 1A detailing the PNP transistor.
Figure 1C:
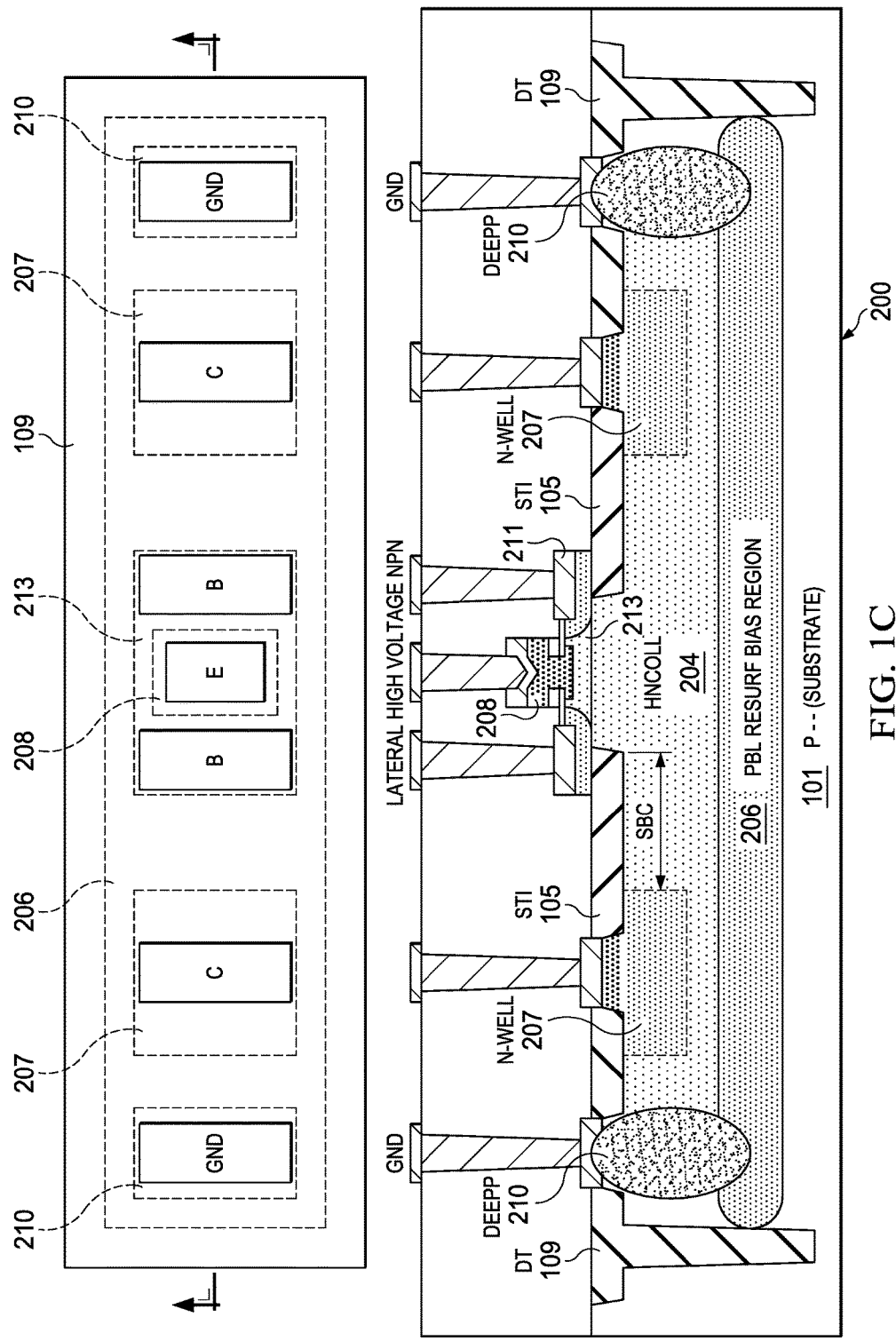
FIG. 1C illustrates an enlarged portion of FIG. 1A detailing the NPN transistor.

In an embodiment of the present invention is shown in FIGS. 1A-1C, the complementary PNP 100 and NPN 200 structures include on a common substrate using bulk silicon technology, having a p-type region 101, active device regions 104 and 204 respectively. The initial doping level of the active device regions 104 and 204 can be n-type, 1e14. In the present example, both the p-type region 101 and the active device regions 104 and 204 are implemented with single-crystal silicon. To create a structure that has higher PNP BV FIG. 3B, a buried n-type resurf region 106 is included under the active device region 104 of the PNP transistor 100, by implanting donor impurities of about 3e16 to 3e18 1/cm3 p-type region 101 prior to collector 104 epitaxial growth. Later in the process flow this n-type region 106 is connected from the top by deep n-type well 110 and is biased at Vcc. In this case it will deplete lateral portions of the PNP collector region and hence, will increase its BV. To create a structure that has higher NPN BV FIG. 3C, a buried p-type resurf region 206 is included under the active device region 204 of the NPN transistor 100, by implanting accepter impurities of about 3e16 to 3e18 1/cm3 into p-type region 101 prior to collector 204 epitaxial growth. Later in the process flow this p-type region 206 is connected from the top by deep p-type well 210 and is biased at GND. In this case it will deplete lateral portions of both the NPN collector region and hence, will increase its BV.

The structure providing a PNP transistor 100 with a higher BV (FIG. 1B) is described below.

First, standard p-type bulk wafer is provided as described in the present invention as shown in FIGS. 1A-1B.

Next, a first masking and implant step is accomplished to implant a high 3e16 to 3e18 1/cm3 dose of n-type species. The highly doped n-layer 106 is vertically under the PNP.

Next, collector 104 epi is grown with very low doping <3e14 1/cm3 and thickness ~3 to 4 um.

A Third masking and etching step is accomplished to provide a hard mask for defining and for deposition of an insulator layer STI 105 in the active device region 104.

Deep trenches 109 are formed, to encircle the PNP transistor 100 and the deep n-type well 110. The trenches extend from the top of the die to the below of the highly doped n-layer 106 and the deep n-type well extends from the top of the die to and through the active device area 104 extending into the highly doped n-layer 106, wherein the deep n-type well 110 touches the implanted highly doped n-layer and extends to the top of the die providing a top contact to the implanted n-layer 106.

A base epitaxial semiconductor layer 113 is deposited, defined and doped with an impurity of the opposite conductivity type on top of the active device region 104 with base contacts 111 coupled thereto. The separation between the base area exposed by the shallow trench isolation STI 105 and p-well 107 is critical in determining the $BV_{CER}$ and $f_T$peak of the PNP transistor as shown in FIG. 4.

And finally, an emitter region 108 covers a portion of the base epitaxial semiconductor layer 113, wherein the emitter region 108 is highly doped with the same conductivity type as the active device region 104.

The structure providing a NPN transistor 200 with a higher BV (FIG. 1C) is described below.

First, standard p-type bulk wafer is provided as described in the present invention as shown in FIGS. 1A and 1C.

Next, a first masking and implant step is accomplished to implant a high 3e16 to 3e18 1/cm3 dose of p-type species. The highly doped p-layer 206 is vertically under the NPN.

Next, collector 204 epi is grown with very low doping <3e14 1/cm3 and thickness ~3 to 4 um.

A Third masking and etching step is accomplished to provide a hard mask for defining and for deposition of an insulator layer STI 105 in the active device region 204.

Deep trenches 109 are formed, to encircle the NPN transistor 200 and the deep p-type well 210. The trenches extend from the top of the die to the below of the highly doped p-layer 206 and the deep p-type well extends from the top of the die to and through the active device area 204 extending into the highly doped p-layer 206, wherein the deep p-type well 210 touches the implanted highly doped p-layer and extends to the top of the die providing a top contact to the implanted p-layer 206.

A base epitaxial semiconductor layer 213 is deposited, defined and doped with an impurity of the opposite conductivity type on top of the active device region 204 with base contacts 111 coupled thereto. The separation between the base area exposed by the shallow trench isolation STI 105 and n-well 207 is critical in determining the $BV_{CER}$ and $f_T$peak of the NPN transistor as shown in FIG. 4.

And finally, an emitter region 208 covers a portion of the base epitaxial semiconductor layer 213, wherein the emitter region 208 is highly doped with the same conductivity type as the active device region 204.

The base epitaxial semiconductor for the NPN and the PNP can be either SiGe or silicon. The base epitaxial semiconductor can also be deposited in two operations, one for the NPN and one for the PNP.

FIG. 2 shows the dependency of $BV_{CER}$ on the collector doping level of the PNP for various base-collector spacings SBC in μm. Numbers aligned with the curves denote base-collector spacing in μm.

FIG. 3 shows the dependency of $BV_{CER}$ on the collector doping level of the NPN for various base-collector spacings SBC in μm. Numbers aligned with the curves denote base-collector spacing in μm.

FIG. 4 shows the dependency of $BV_{CER}$ on for various base-collector spacings SBC in μm for both NPNs and PNPs. Collector doping is 3e15 for the PNP and 2e15 for the NPN.

The present invention offers three advantages over existing SOI architectures:

(1) The process flow starts with cheap standard bulk wafer.
(2) Proper bias can be applied to PNP and NPN buried layers to use re-surf effect to its full strength. According to TCAD results, similar $f_T$peak*$BV_{CEO}$ numbers compared to devices on SOI can be achieved.
(3) Self-heating will be much lower.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
complementary PNP and NPN structures, wherein the PNP and NPN structures are disposed in a p-type semiconductor substrate;
the PNP structure comprising:
a p-type collector region coupled to a collector contact;
a buried n-type region under the p-type collector region, the buried n-type region being coupled to a bias voltage contact;
an n-type base region over the p-type collector region, the n-type base region being coupled to a base contact of the PNP structure;
a p-type emitter region covering a portion of the n-type base region, the p-type emitter region coupled to an emitter contact of the PNP structure;
the NPN structure comprising:
an n-type collector region coupled to a collector contact;
a buried p-type region under the n-type collector region, the buried p-type region being coupled to a ground contact;
a p-type base region over the n-type collector region, the p-type base region being coupled to a base contact of the NPN structure;
a n-type emitter region covering a portion of the p-type base region, the n-type emitter region coupled to an emitter contact of the NPN structure; and
trench isolation regions surrounding the NPN structure and the PNP structure, wherein the trench isolation regions isolate the complementary PNP and NPN structures from each other and wherein the trench isolation region extend deeper than the buried p-type region and the buried n-type region.

2. The integrated circuit of claim 1, wherein the collector contact of the PNP structure is between the bias voltage contact and the base contact of the PNP structure and the collector contact of the NPN structure is between the ground contact and the base contact of the NPN structure.

3. The integrated circuit of claim 2, wherein the PNP structure further comprises an n-type well between the bias voltage contact and the buried n-type region and the NPN structure further comprises a p-type well between the ground contact and the buried p-type region.

4. The integrated circuit structure of claim 3, wherein the p-type collector region has an acceptor doping of <3e14 $1/cm^3$ and thickness of 3 to 4 um.

5. The integrated circuit structure of claim 4, wherein the buried n-type region has a dose of 3e16 to 3e18 $1/cm^3$ of an n-type species.

6. The integrated circuit structure of claim 5, wherein the n-type collector region has a donor doping of <3e14 $1/cm^3$ and thickness of 3 to 4 um.

7. The integrated circuit structure of claim 1, wherein the buried p-type region has a dose of 3e16 to 3e18 $1/cm^3$ of a p-type species.

8. A method of forming an integrated circuit, comprising:
forming a PNP structure by:
forming a buried n-type region by implanting an n-type species into a p-type bulk wafer;
forming a p-type collector region over the buried n-type region by epitaxial deposition and doping;
forming an n-type base region over the p-type collector region by epitaxial deposition and doping;
forming a p-type emitter region over the n-type base region;
forming a NPN structure by:
forming a buried p-type region by implanting a p-type species into the p-type bulk wafer;
forming an n-type collector region over the buried region by epitaxial deposition and doping;
forming a p-type base region over the n-type collector region by epitaxial deposition and doping;
forming a n-type emitter region over the p-type base region; and
forming trench isolation regions surrounding the NPN structure and the PNP structure, wherein the trench isolation regions isolate the PNP and NPN structures from each other and wherein the trench isolation region extend deeper than the buried n-type region and the buried p-type region.

9. The method of claim 8, further comprising:
forming a Vcc contact coupled to the buried n-type region;
forming a first collector contact coupled to the p-type collector region;
forming a first base contact coupled to the n-type base region;
forming a first emitter contact coupled to the p-type emitter region;
forming a ground contact coupled to the buried p-type region;
forming a second collector contact coupled to the n-type collector region;
forming a second base contact coupled to the p-type base region; and
forming a second emitter contact coupled to the n-type emitter region.

10. The method of claim 9, wherein the p-type collector region has an acceptor doping of <3e14 $1/cm^3$ and thickness of 3 to 4 um.

11. The method of claim 10, wherein the buried n-type region has a dose of 3e16 to 3e18 $1/cm^3$ of an n-type species.

12. The method of claim 11, wherein the n-type collector region has a donor doping of <3e14 $1/cm^3$ and thickness of 3 to 4 um.

13. The method of claim 8, wherein the buried p-type region has a dose of 3e16 to 3e18 $1/cm^3$ of a p-type species.

14. An integrated circuit, comprising:
complementary PNP and NPN structures, wherein the PNP and NPN structures are disposed in a p-type semiconductor substrate;
the PNP structure comprising:
a first p-type region coupled to a collector contact;
a buried n-type region under the first p-type region, the buried n-type region being coupled to a bias voltage contact;
an n-type region over the first p-type region, the n-type region being coupled to a base contact of the PNP structure;
a second p-type region covering a portion of the n-type region, the second p-type region coupled to an emitter contact of the PNP structure;
the NPN structure comprising:
a first n-type region coupled to a collector contact;

a buried p-type region under the first n-type region, the buried p-type region being coupled to a ground contact;

a p-type region over the first n-type region, the p-type region being coupled to a base contact of the NPN structure;

a second n-type region covering a portion of the p-type region, the second n-type region coupled to an emitter contact of the NPN structure; and trench isolation regions surrounding the NPN structure and the PNP structure, wherein the trench isolation regions isolate the complementary PNP and NPN structures from each other and wherein the trench isolation regions extend deeper than the buried p-type region and the buried n-type region.

15. The integrated circuit of claim 14, wherein the collector contact of the PNP structure is between the bias voltage contact and the base contact of the PNP structure and the collector contact of the NPN structure is between the ground contact and the base contact of the NPN structure.

16. The integrated circuit of claim 15, wherein the PNP structure further comprises an n-type well between the bias voltage contact and the buried n-type region and the NPN structure further comprises a p-type well between the ground contact and the buried p-type region.

* * * * *